(12) United States Patent
Takenaka

(10) Patent No.: US 6,396,342 B1
(45) Date of Patent: May 28, 2002

(54) MICROWAVE AMPLIFIER GENERATING DISTORTION-REDUCED HIGH OUTPUT MICROWAVE POWER

(75) Inventor: Isao Takenaka, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/686,806

(22) Filed: Oct. 12, 2000

(30) Foreign Application Priority Data

Oct. 12, 1999 (JP) .......................................... 11-290045

(51) Int. Cl.[7] .............................................. H03F 1/00
(52) U.S. Cl. ........................................ 330/65; 330/66
(58) Field of Search .............................. 330/65, 66, 67, 330/68

(56) References Cited

U.S. PATENT DOCUMENTS

| | | | | |
|---|---|---|---|---|
| 5,164,683 A | * | 11/1992 | Shields | 330/307 |
| 5,177,452 A | * | 1/1993 | Honjo | 330/277 |
| 5,352,991 A | * | 10/1994 | Lipscheltz et al. | 330/289 |
| 5,576,661 A | * | 11/1996 | Kumagai | 330/277 |
| 6,181,200 B1 | * | 1/2001 | Titizian et al. | 330/66 |

* cited by examiner

Primary Examiner—Benny Lee
Assistant Examiner—Henry Choe
(74) Attorney, Agent, or Firm—Young & Thompson

(57) ABSTRACT

A microwave amplifier includes an amplifying device having a first contact region extending in a width direction, an output side impedance device spaced from the amplifying device in a transmission direction perpendicular to the width direction, the impedance device having a second contact region connected to the first contact region of the amplifying device, the second contact region extending in the width direction, and a smoothing circuit connected to one of the first and second contact regions for smoothing a distortion in a microwave signal to be amplified by the amplifying device.

32 Claims, 9 Drawing Sheets

MICROWAVE AMPLIFIER GENERATING DISTORTION-REDUCED HIGH OUTPUT MICROWAVE POWER

BACKGROUND OF THE INVENTION

The present invention relates to a microwave amplifier for amplifying microwave power, and more particularly to a microwave amplifier for generating high output microwave power that is reduced in distortion for applications to satellite and cellular communication, and industrial, scientific, and medical technology.

The microwave amplifier has a field effect transistor such as a compound semiconductor field effect transistor which is superior in high speed and high frequency performances, for example, a GaAs field effect transistor. The microwave amplifier is required to have high output and high efficient performances or characteristics for realizing further reductions in size and power consumption thereof. For these purposes, it is required that the microwave amplifier is superior in linearity with a reduced relative modulation distortion to avoid any undesirable influence to other channels. If plural microwaves including different carrier frequencies are inputted into the single microwave amplifier, non-linearity of the microwave amplifier generates not only the relative modulation distortion also a secondary distortion due to differential frequency of the different carrier frequencies.

The microwave amplifier is so designed that plural field effect transistors are connected in parallel to each other to form a multiple finger structure and to increase a gate width. If the microwave amplifier is high in impedance in a low frequency band, then the increased secondary distortion appears on the frequencies of the input signals, whereby the input signals show mixing with the amplified signals at drain electrodes of the field effect transistors. As a result, the relative modulation distortion is increased. This means that the linearity of the field effect transistors is never utilized effectively.

In order to solve the above problem, it was proposed to have improved the distortion characteristic of the microwave amplifier even for amplifying the microwave including plural different carrier frequencies. This conventional technique is disclosed in Japanese laid-open patent publication No. 10-233638. FIG. 1 is a schematic diagram illustrative of a first conventional microwave amplifier having improved the distortion characteristic of the microwave amplifier for amplifying the microwave including plural different carrier frequencies, wherein plural field effect transistors are internally matched to each other for parallel operations thereof. The conventional microwave amplifier has an input gate electrode 70 for receiving inputs of plural input microwaves and an output drain electrode 76 from which a synthesized microwave is outputted. The conventional microwave amplifier has a distributor circuit 71, a first impedance-matching circuit 72, a second impedance matching circuit 82, a first field effect transistor circuit 73, a second field effect transistor circuit 83, a first bonding pattern 77, a second bonding pattern 87, a first micro-strip line 51, a second micro-strip line 52, a first capacitor 55, a second capacitor 56, a third impedance-matching circuit 74, a fourth impedance-matching circuit 84, and a synthesizer circuit 75. The distributor circuit 71 has a single input which is connected to the input gate 70 and a first output connected to the first impedance-matching circuit 72 and a second output connected to the second impedance matching circuit 82. The first impedance-matching circuit 72 has an input side connected to the first output of the distributor circuit 71 and an output side connected to an input side of the first field effect transistor circuit 73. The second impedance-matching circuit 82 has an input side connected to the second output of the distributor circuit 71 and an output side connected to an input side of the second field effect transistor circuit 83. The first field effect transistor circuit 73 has an input side connected to the first impedance-matching circuit 72 and an output side connected through the first bonding pattern 77 to an input side of the third impedance-matching circuit 74. The second field effect transistor circuit 83 has an input side connected to the second impedance-matching circuit 82 and an output side connected through the second bonding pattern 87 to an input side of the fourth impedance-matching circuit 84. The third impedance-matching circuit 74 has the input side connected through the first bonding pattern 77 to the first field effect transistor circuit 73 and an output side connected to a first input side of the synthesizer circuit 75. The fourth impedance-matching circuit 84 has the input side connected through the second bonding pattern 87 to the second field effect transistor circuit 83 and an output side connected to a second input side of the synthesizer circuit 75. The synthesizer circuit 75 has the first input side connected to the third impedance-matching circuit 74 and the second input side connected to the fourth impedance-matching circuit 84 as well as has an output side connected to the drain output electrode 76. Further, the first micro-strip line 51 and the first capacitor 55 are connected in series between the first bonding pattern 77 and a first ground electrode GND-1 to form a first LC circuit, wherein the first micro-strip line 51 is shorter than one-quarter microwave for smoothing the secondary distortion due to the differential frequency of the carrier frequencies. The second micro-strip line 52 and the second capacitor 56 are connected in series between the second bonding pattern 87 and a second ground electrode GND-2 to form a second LC circuit, wherein the second micro-strip line 52 is shorter than one-quarter microwave for smoothing the secondary distortion due to the differential frequency of the carrier frequencies.

The microwave signals including the plural different carrier frequencies are inputted into the input gate electrode 70 and the inputted microwave signals are then distributed by the distributor circuit 71 to both the first and second impedance-matching circuits 72 and 82 for executing the impedance-matching to the distributed microwave signals. The impedance-matched microwave signals are then amplified by the first and second field effect transistor circuits 73 and 83. The amplified microwave signals are further transmitted through the first and second bonding patterns 77 and 87 to the third and fourth impedance-matching circuits 74 and 84, wherein the secondary distortions of the amplified microwave signals due to the differential frequencies of the different carrier frequencies are smoothed by the first and second LC circuits having the first and second micro-strip lines 51 and 52 and the first and second capacitors 55 and 56. The amplified and smoothed microwave signals are then transmitted to the third and fourth impedance-matching circuits 74 and 84 for executing further impedance-matching to the signals. The impedance matched microwave signals are then transmitted to the synthesizer circuit 75 for generating a synthesized microwave output signal which is to be outputted from the drain output terminal 76.

If the microwaves including plural different carrier frequencies are inputted into the above conventional microwave amplifier, then the secondary distortion is generated due to the differential frequency of the carrier frequencies. If, for example, the microwave includes first and second carrier frequencies f1 and f2 different from each other, then the secondary distortion has a differential frequency defined to be |f2–f1| which increases the relative modulation distortion. For these reasons, the first and second LC circuits comprising the first and second micro-strip lines 51 and 52 and the first and second capacitors 55 and 56 are provided for reducing the impedance by the resonance. Further, the first and second LC circuits are connected to the first and second ground electrodes 55 and 56 respectively for smoothing and reducing the secondary distortion due to the differential frequency of the carrier frequencies.

The above described conventional microwave amplifier raises the following problems if the high output characteristics are required. In order to allow the microwave amplifier to have the high output characteristics, it is necessary to increase the gate width of the field effect transistors circuits included in the microwave amplifier, whereby the output power from the field effect transistors is increased. The increase in the output power from the field effect transistors, however, causes an increase in the secondary distortion due to the differential frequency of the carrier frequencies. The above conventional microwave amplifier has the first and second LC circuits which comprise the first and second micro-strip lines 51 and 52 and the first and second capacitors 55 and 56 for smoothing the secondary distortion. However, the first micro-strip line 51 is connected to an outside edge of the first bonding pattern 77, and also the second micro-strip line 52 is connected to an outside edge of the second bonding pattern 87.

In the above circumstances, it had been required to develop a novel microwave amplifier free from the above problem.

SUMMARY OF THE INVENTION

Accordingly, it is an object of the present invention to provide a novel microwave amplifier free from the above problems.

It is a further object of the present invention to provide a novel microwave amplifier capable of generating a distortion-reduced high output microwave power.

The present invention provides a microwave amplifier having: at least an amplifying device for amplifying a microwave including plural different frequencies, and the at least amplifying device having a first contact region extending in a width direction; and at least an output side impedance device being distanced from the at least amplifying device in a transmission direction perpendicular to the width direction, and the at least output side impedance device having a second contact region interconnected to the first contact region of the at least amplifying device, and the second contact region extending in the width direction, wherein at least a smoothing circuit connected to just or generally entire of the second contact region of the at least output side impedance device for smoothing a distortion generated by a differential frequency of plural different carrier frequencies included in a microwave signal to be amplified by the amplifying device.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

Figure 1:
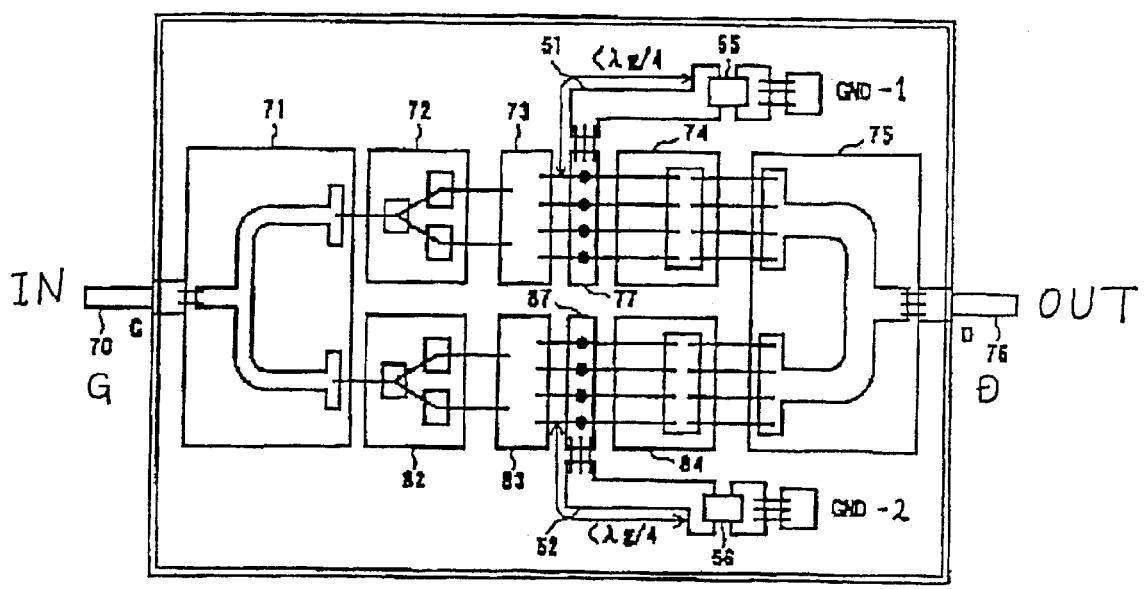
FIG. 1 is a schematic diagram illustrative of a first conventional microwave amplifier having improved the distortion characteristic of the microwave amplifier for amplifying the microwave including plural different carrier frequencies.

The first present invention provides a microwave amplifier having: at least an amplifying device for amplifying a microwave including plural different frequencies, and the at least amplifying device having a first contact region extending in a width direction; and at least an output side impedance device being distanced from the at least amplifying device in a transmission direction perpendicular to the width direction, and the at least output side impedance device having a second contact region interconnected to the first contact region of the at least amplifying device, and the second contact region extending in the width direction, wherein at least a smoothing circuit connected to just or generally entire of the second contact region of the at least output side impedance device for smoothing a distortion generated by a differential frequency of plural different carrier frequencies included in a microwave signal to be amplified by the amplifying device.

It is preferable that the at least smoothing circuit extends in the width direction and is interposed between the at least amplifying device and the at least output side impedance device.

It is further preferable that the at least smoothing circuit comprises an LC circuit which further comprises: a smoothing capacitor extending in the width direction and being interposed between the at least amplifying device and the at least output side impedance device; and an interconnection structure inter-connecting a third contact region of the smoothing capacitor to just or generally entire of the second contact region.

It is further more preferable that the interconnection structure comprises a plurality of first bonding-wires extending in the transmission direction and being aligned in the width direction so that the first bonding-wires are almost uniformly distributed over just or generally entire of the second contact region and also over just or generally entire of the third contact region.

It is moreover preferable that the first contact region of the at least amplifying device and the second contact region of the at least output side impedance device are inter-connected to each other through a plurality of second bonding-wires which extend in the transmission direction and which are aligned in the width direction so that the second bonding-wires are almost uniformly distributed over just or generally entire of the first contact region and also over just or generally entire of the second contact region, and the second bonding-wires are longer than the first bonding-wires.

It is still further more preferable that the first, second and third contact regions have substantially the same width.

It is yet further more preferable that, on the second contact region, the first and second bonding-wires are aligned alternatively to form a single straight line of bonding positions.

It is also preferable that the at least smoothing capacitor and the at least amplifying device are formed on a first substrate, whilst the at least output side impedance device is provided on a second substrate, and the first and second substrates are provided on a common package board.

It is also preferable that the at least smoothing circuit is positioned in an output side of the second contact region, so that the second contact region is interposed between the at least amplifying device and the at least smoothing circuit.

It is further preferable that the at least smoothing circuit comprises an LC circuit which further comprises: at least a pair of smoothing capacitors positioned in an output side of the at least output side impedance device so that the at least output side impedance device is interposed between the at least amplifying device and the smoothing capacitors; and an interconnection structure inter-connecting a third contact region of each of the smoothing capacitors to just or generally entire of the second contact region.

It is further more preferable that the interconnection structure comprises a plurality of first bonding-wires extending almost in the transmission direction and being aligned in the width direction so that the first bonding-wires are almost uniformly distributed over just or generally entire of the second contact region and also over just or generally entire of the third contact region.

It is more over preferable that the first contact region of the at least amplifying device and the second contact region of the at least output side impedance device are interconnected to each other through a plurality of second bonding-wires which extend in the transmission direction and which are aligned in the width direction so that the second bonding-wires are almost uniformly distributed over just or generally entire of the first contact region and also over just or generally entire of the second contact region, and the second bonding-wires are shorter than the first bonding-wires.

It is still further more preferable that the first and second contact regions have substantially the same width and the third contact with of each of the smooth capacitors is narrower than the first and second contact regions.

It is yet further more preferable that, on the second contact region, the first and second bonding-wires are aligned alternatively to form a single straight line of bonding positions.

It is also preferable that the smoothing capacitors are formed on a metal carrier together with at least an impedance-matching capacitor, whilst and the at least amplifying device is formed on a first substrate, and the at least output side impedance device is provided on a second substrate, and the first and second substrates and the metal carrier are provided on a common package board.

It is also preferable that the at least amplifying device comprises a field effect transistor chip having an alignment of plural field effect transistors.

The second present invention provides a microwave amplifier having: at least an amplifying device for amplifying a microwave including plural different frequencies, and the at least amplifying device having a first contact region extending in a width direction; and at least an output side impedance device being distanced from the at least amplifying device in a transmission direction perpendicular to the width direction, and the at least output side impedance device having a second contact region interconnected to the first contact region of the at least amplifying device, and the second contact region extending in the width direction, wherein at least a smoothing circuit connected to just or generally entire of the first contact region of the at least amplifying device for smoothing a distortion generated by a differential frequency of plural different carrier frequencies included in a microwave signal to be amplified by the amplifying device.

It is preferable that the at least smoothing circuit extends in the width direction and is interposed between the at least amplifying device and the at least output side impedance device.

It is further preferable that the at least smoothing circuit a resonant-LC circuit which further comprises: a smoothing capacitor extending in the width direction and being interposed between the at least amplifying device and the at least output side impedance device; and an interconnection structure inter-connecting a third contact region of the smoothing capacitor to just or generally entire of the first contact region.

It is further more preferable that the interconnection structure comprises a plurality of first bonding-wires extending in the transmission direction and being aligned in the width direction so that the first bonding-wires are almost uniformly distributed over just or generally entire of the first contact region and also over just or generally entire of the third contact region.

It is more over preferable that the first contact region of the at least amplifying device and the second contact region of the at least output side impedance device are interconnected to each other through a plurality of second bonding-wires which extend in the transmission direction and which are aligned in the width direction so that the second bonding-wires are almost uniformly distributed over just or generally entire of the first contact region and also over just or generally entire of the second contact region, and the second bonding-wires are longer than the first bonding-wires.

It is still further more preferable that the first, second and third contact regions have substantially the same width.

It is yet further more preferable that, on the first contact region, the first and second bonding-wires are aligned alternatively to form a single straight line of bonding positions.

It is also preferable that the at least smoothing capacitor and the at least amplifying device are formed on a first substrate, whilst the at least output side impedance device is provided on a second substrate, and the first and second substrates are provided on a common package board.

It is also preferable that the at least smoothing circuit is positioned in an output side of the second contact region, so that the second contact region is interposed between the at least amplifying device and the at least smoothing circuit.

It is further preferable that the at least smoothing circuit comprises a resonant-LC circuit which further comprises: at least a pair of smoothing capacitors positioned in an output side of the at least output side impedance device so that the at least output side impedance device is interposed between the at least amplifying device and the smoothing capacitors; and an interconnection structure inter-connecting a third contact region of each of the smoothing capacitors to just or generally entire of the first contact region.

It is further more preferable that the interconnection structure comprises a plurality of first bonding-wires extending almost in the transmission direction and being aligned in the width direction so that the first bonding-wires are almost uniformly distributed over just or generally entire of the first contact region and also over just or generally entire of the third contact region.

It is still further more preferable that the first contact region of the at least amplifying device and the second contact region of the at least output side impedance device are inter-connected to each other through a plurality of second bonding-wires which extend in the transmission direction and which are aligned in the width direction so that the second bonding-wires are almost uniformly distributed over just or generally entire of the first contact region and also over just or generally entire of the second contact region, and the second bonding-wires are shorter than the first bonding-wires.

It is more over preferable that the first and second contact regions have substantially the same width and the third contact with of each of the smooth capacitors is narrower than the first and second contact regions.

It is still more over preferable that, on the first contact region, the first and second bonding-wires are aligned alternatively to form a single straight line of bonding positions.

It is also preferable that the smoothing capacitors are formed on a metal carrier together with at least an impedance-matching capacitor, whilst and the at least amplifying device is formed on a first substrate, and the at least output side impedance device is provided on a second substrate, and the first and second substrates and the metal carrier are provided on a common package board.

It is also preferable that the at least amplifying device comprises a field effect transistor chip having an alignment of plural field effect transistors.

The third present invention provides a microwave amplifier having: at least a field effect transistor chip for amplifying a microwave including plural different frequencies, and the at least field effect transistor chip having a first contact region extending in a width direction; and at least an output side impedance device being distanced from the at least field effect transistor chip in a transmission direction perpendicular to the width direction, and the at least output side impedance device having a second contact region interconnected to the first contact region of the at least field effect transistor chip, and the second contact region extending in the width direction, wherein at least a smoothing circuit extends in the width direction and is interposed between the at least field effect transistor chip and the at least output side impedance device, and the at least smoothing circuit is connected to just or generally entire of the second contact region of the at least output side impedance device for smoothing a distortion generated by a differential frequency of plural different carrier frequencies included in a microwave signal to be amplified by the field effect transistor chip, and wherein the at least smoothing circuit comprises an LC circuit which further comprises: a smoothing capacitor extending in the width direction and being interposed between the at least field effect transistor chip and the at least output side impedance device; and an interconnection structure inter-connecting a third contact region of the smoothing capacitor to just or generally entire of the second contact region.

It is preferable that the interconnection structure comprises a plurality of first bonding-wires extending in the transmission direction and being aligned in the width direction so that the first bonding-wires are almost uniformly distributed over just or generally entire of the second contact region and also over just or generally entire of the third contact region.

It is further preferable that the first contact region of the at least field effect transistor chip and the second contact region of the at least output side impedance device are inter-connected to each other through a plurality of second bonding-wires which extend in the transmission direction and which are aligned in the width direction so that the second bonding-wires are almost uniformly distributed over just or generally entire of the first contact region and also over just or generally entire of the second contact region, and the second bonding-wires are longer than the first bonding-wires.

It is further more preferable that the first, second and third contact regions have substantially the same width.

It is more over preferable that, on the second contact region, the first and second bonding-wires are aligned alternatively to form a single straight line of bonding positions.

It is also preferable that the at least smoothing capacitor and the at least field effect transistor chip are formed on a first substrate, whilst the at least output side impedance device is provided on a second substrate, and the first and second substrates are provided on a common package board.

The fourth present invention provides a microwave amplifier having: at least a field effect transistor chip for amplifying a microwave including plural different frequencies, and the at least field effect transistor chip having a first contact region extending in a width direction; and at least an output side impedance device being distanced from the at least field effect transistor chip in a transmission direction perpendicular to the width direction, and the at least output side impedance device having a second contact region interconnected to the first contact region of the at least field effect transistor chip, and the second contact region extending in the width direction, wherein at least a smoothing circuit is positioned in an output side of the second contact region, so that the second contact region is interposed between the at least field effect transistor chip and the at least smoothing circuit, and the at least smoothing circuit is connected to just or generally entire of the second contact region of the at least output side impedance device for smoothing a distortion generated by a differential frequency of plural different carrier frequencies included in a microwave signal to be amplified by the field effect transistor chip, and wherein the at least smoothing circuit comprises an LC circuit which further comprises: a smoothing capacitor extending in the width direction and being interposed between the at least field effect transistor chip and the at least output side impedance device; and an interconnection structure inter-connecting a third contact region of the smoothing capacitor to just or generally entire of the second contact region.

It is preferable that the at least smoothing circuit comprises an LC circuit which further comprises: at least a pair of smoothing capacitors positioned in an output side of the at least output side impedance device so that the at least output side impedance device is interposed between the at least field effect transistor chip and the smoothing capacitors; and an interconnection structure inter-connecting a third contact region of each of the smoothing capacitors to just or generally entire of the second contact region.

It is further preferable that the interconnection structure comprises a plurality of first bonding-wires extending almost in the transmission direction and being aligned in the width direction so that the first bonding-wires are almost uniformly distributed over just or generally entire of the second contact region and also over just or generally entire of the third contact region.

It is further more preferable that the first contact region of the at least field effect transistor chip and the second contact region of the at least output side impedance device are inter-connected to each other through a plurality of second bonding-wires which extend in the transmission direction and which are aligned in the width direction so that the second bonding-wires are almost uniformly distributed over just or generally entire of the first contact region and also over just or generally entire of the second contact region, and the second bonding-wires are shorter than the first bonding-wires.

It is still further more preferable that the first and second contact regions have substantially the same width and the third contact with of each of the smooth capacitors is narrower than the first and second contact regions.

It is moreover preferable that, on the second contact region, the first and second bonding-wires are aligned alternatively to form a single straight line of bonding positions.

It is also preferable that the smoothing capacitors are formed on a metal carrier together with at least an impedance-matching capacitor, whilst and the at least field effect transistor chip is formed on a first substrate, and the at least output side impedance device is provided on a second substrate, and the first and second substrates and the metal carrier are provided on a common package board.

PREFERRED EMBODIMENT

FIRST EMBODIMENT

Figure 2:
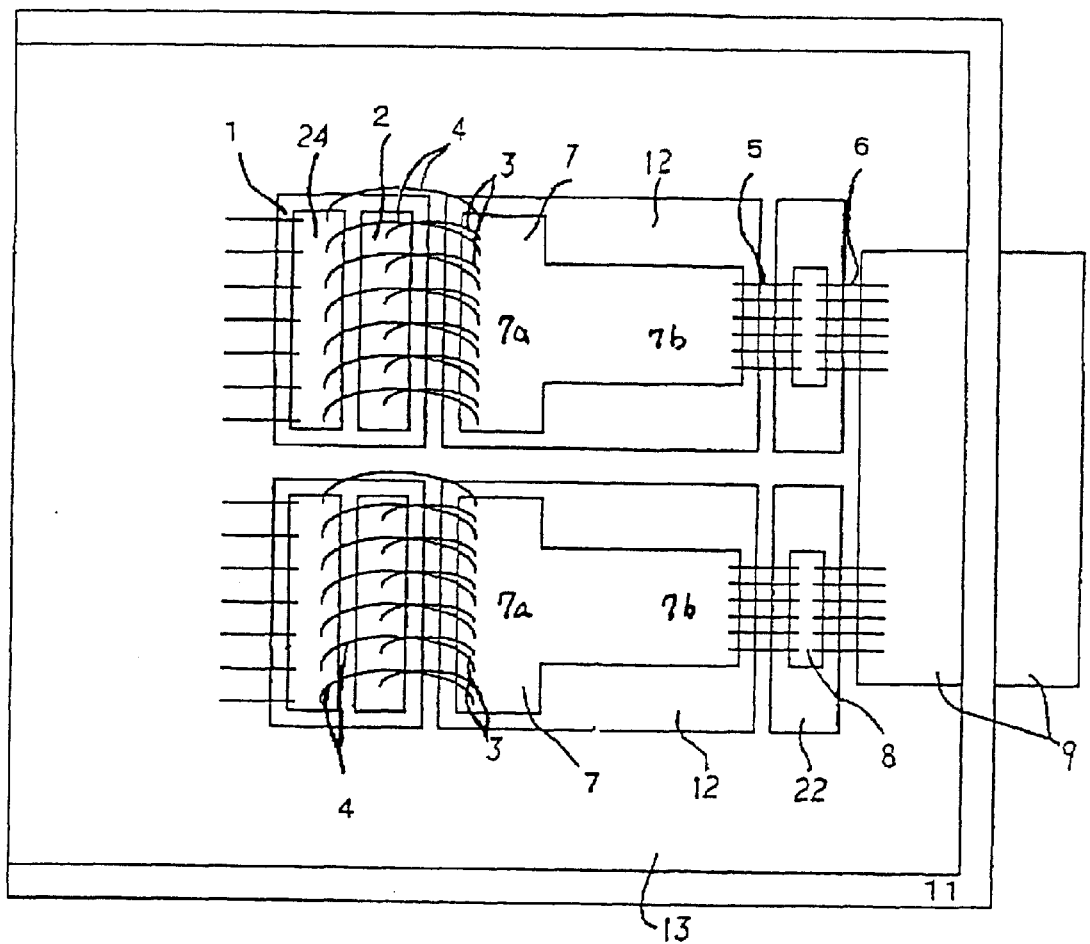
FIG. 2 is a fragmentary plane view illustrative of a circuit configuration between amplifying devices and an output terminal of a novel microwave amplifier in a first embodiment according to the present invention.
Figure 3A:
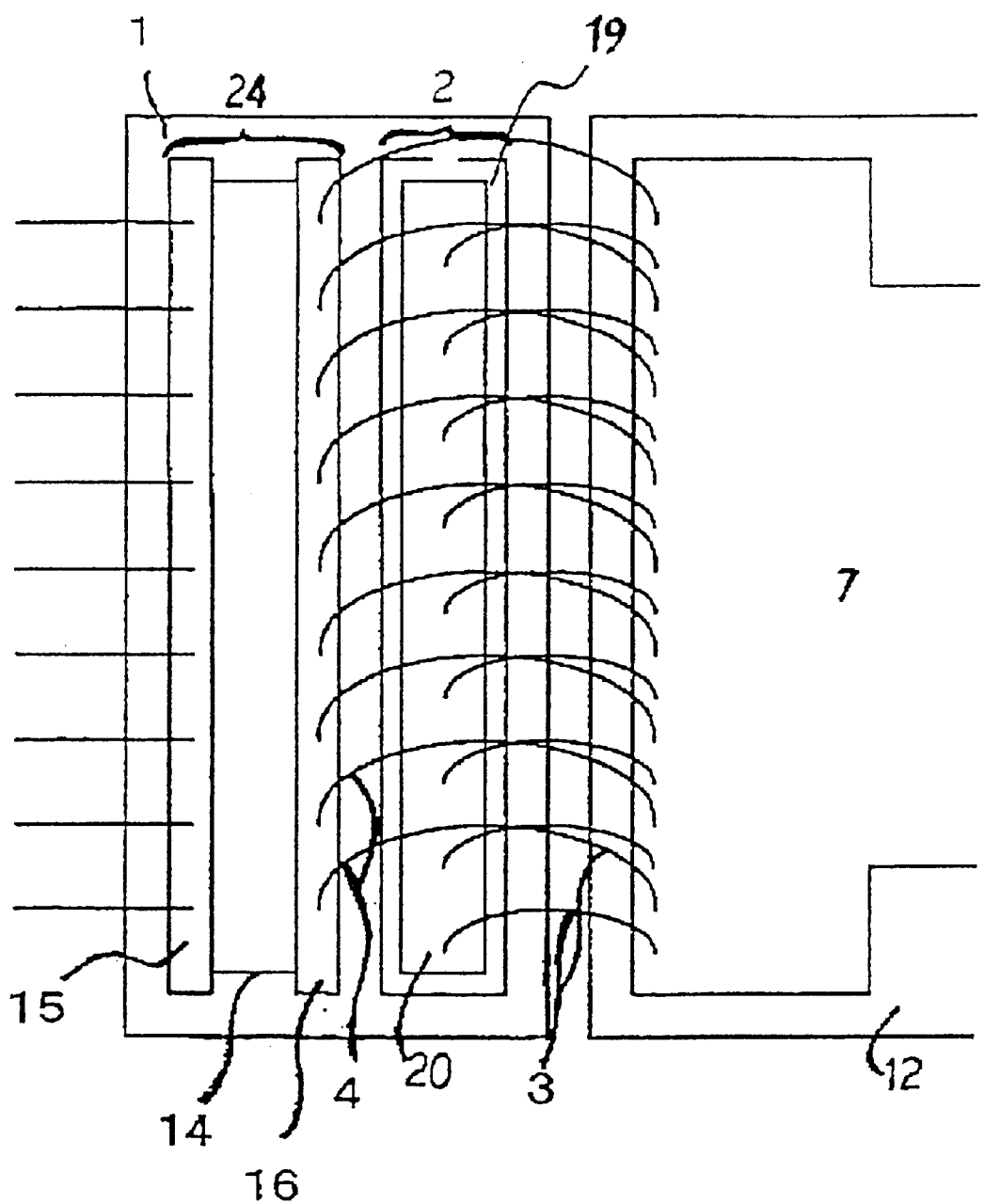
FIG. 3A is a fragmentary enlarged plane view illustrative of a first smoothing circuit configuration between amplifying devices and an output side impedance device of the novel microwave amplifier shown in FIG. 2.
Figure 3B:
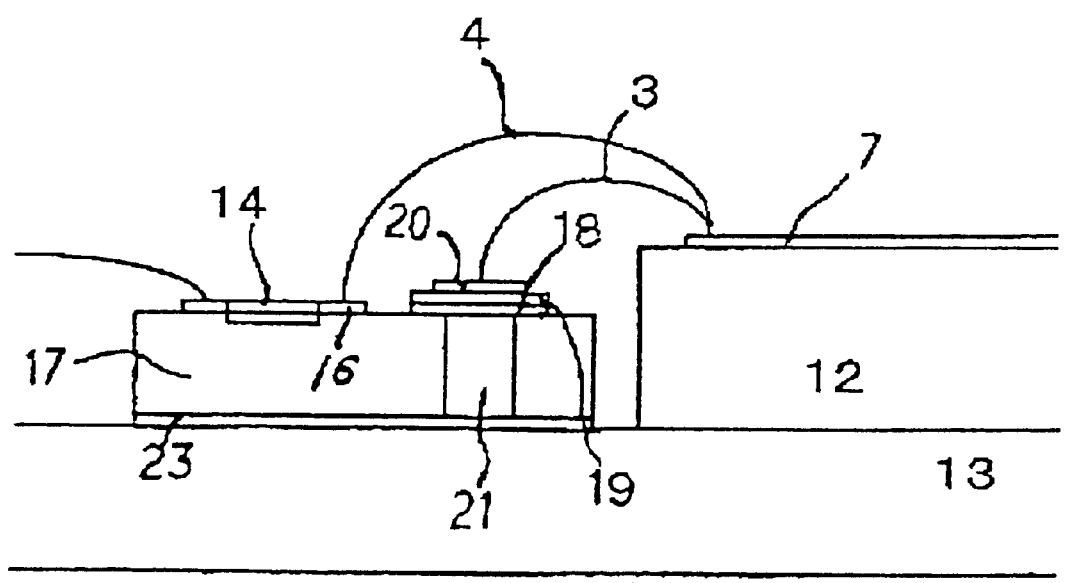
FIG. 3B is a fragmentary enlarged cross sectional elevation view illustrative of a first smoothing circuit configuration between amplifying devices and an output side impedance device of the novel microwave amplifier shown in FIG. 2.
Figure 4:
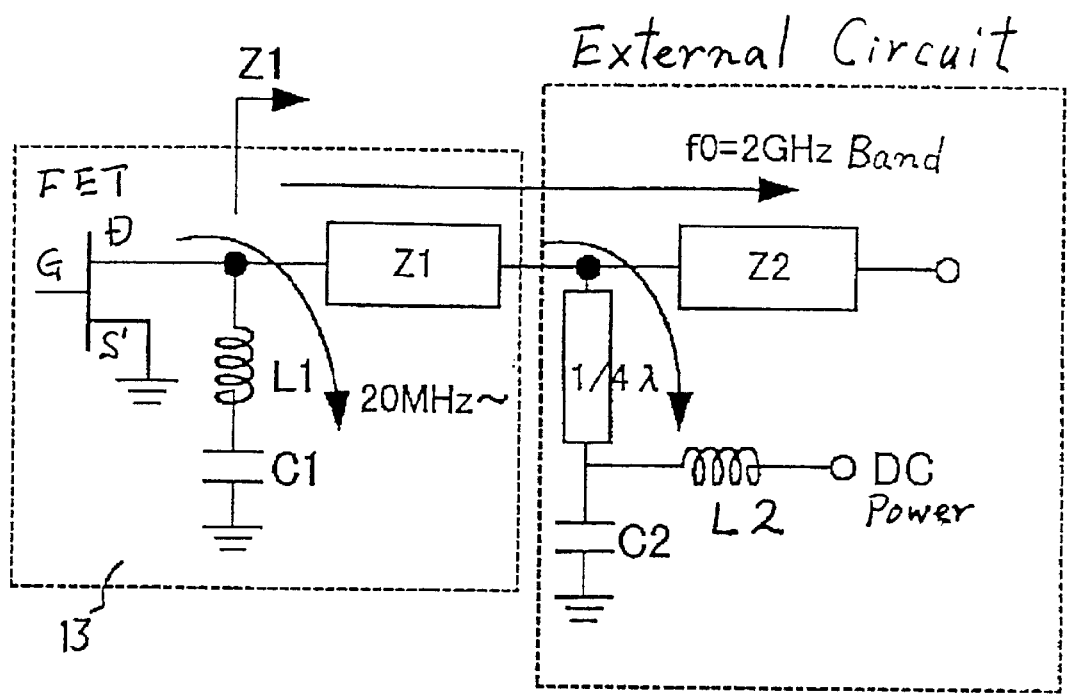
FIG. 4 is a circuit diagram illustrative of a novel microwave amplifier connected to an external circuit in a first embodiment in accordance with the present invention.

A first embodiment according to the present invention will be described in detail with reference to the drawings. FIG. 2 is a fragmentary plane view illustrative of a circuit configuration between amplifying devices and an output terminal of a novel microwave amplifier in a first embodiment according to the present invention. FIG. 3A is a fragmentary enlarged plane view illustrative of a first smoothing circuit configuration between amplifying devices and an output side impedance device of the novel microwave amplifier shown in FIG. 2. FIG. 3B is a fragmentary enlarged cross sectional elevation view illustrative of a first smoothing circuit configuration between amplifying devices and an output side impedance device of the novel microwave amplifier shown in FIG. 2. FIG. 4 is a circuit diagram illustrative of a novel microwave amplifier connected to an external circuit in a first embodiment in accordance with the present invention.

A novel microwave amplifier has an input terminal, a distribution circuit connected to the input terminal and input side impedance matching devices connected to the distribution circuit, amplifying devices connected to the input side impedance matching devices for amplifying microwaves, output side impedance devices connected to the amplifying devices and an output terminal connected to the output side impedance devices as in the conventional microwave amplifier as described above. The improvement in the novel microwave amplifier is in the circuit configuration between the amplifying devices and the output terminal, for which reason the following descriptions will focus on the improved circuit configuration of the novel microwave amplifier.

A pair of field effect transistor chips 24 is provided for amplifying a microwave including plural different frequencies. Each of the field effect transistor chips 24 has a line-shaped first contact region extending in a width direction perpendicular to a transmission direction along which microwave signals are transmitted throughout the microwave amplifier. A pair of output side impedance lines 7 is provided to be distanced from the field effect transistor chips 24 in the transmission direction perpendicular to the width direction. Each of the output side impedance lines 7 has a line-shaped second contact region which is interconnected to the first contact region of the corresponding field effect transistor chip 24. The second contact region of each of the output side impedance lines 7 extends in the width direction. A pair of smoothing circuits extends in the width direction and is interposed between the field effect transistor chip 24 and the output side impedance line pattern 7. The smoothing circuit is connected to all or part of the second contact region of the output side impedance line pattern 7 for smoothing a distortion generated by a differential frequency of plural different carrier frequencies included in a microwave signal amplified by the field effect transistor chip 24. Each of the smoothing circuits comprises an LC circuit which further comprises a smoothing capacitor 2 extending in the width direction and being interposed between the field effect transistor chip 24 and the output side impedance line pattern 7, and a first interconnection structure 3 interconnecting a third contact region of the smoothing capacitor 2 to all or part of the second contact region of the output side impedance line pattern 7. The first interconnection structure 3 comprises a plurality of first bonding-wires 3 extending in the transmission direction that are aligned in the width direction so that output side bonding positions of the first bonding-wires 3 are almost uniformly distributed at almost constant pitch throughout all or part of the second contact region of the output side impedance line pattern 7, whilst input side bonding positions of the first bonding-wires 3 are almost uniformly distributed at almost constant pitch throughout all or part of the third contact region of the smoothing capacitor 2. The first contact region of the field effect transistor chip 24 and the second contact region of the output side impedance line pattern 7 are inter-connected to each other through a plurality of second bonding-wires 4 which extend in the transmission direction and which are aligned in the width direction so that input side bonding positions of the second bonding-wires 4 are almost uniformly distributed over all or part of the first contact region of the field effect transistor chip 24, while output side bonding positions of the second bonding-wires 4 are almost uniformly distributed over all or part of the second contact region of the output side impedance line pattern 7. The second bonding-wires 4 are longer than the first bonding-wires 3. The first, second and third contact regions have substantially the same width. On the second contact region of the output side impedance line pattern 7, the first and second bonding-wires 3 and 4 are aligned alternatively to form a single straight line of bonding positions. The smoothing capacitor 2 and the field effect transistor chip 24 are integrated in a single field effect transistor circuit 1 which is positioned on input side of the output side impedance line pattern 7. Each of the field effect transistor circuits 1 is formed on a semiconductor substrate 17. Each of the output side impedance line pattern 7 is provided on an insulative substrate 12 of alumina, and the first and second substrates are provided on a common package board. The output side impedance line pattern 7 has a wide region 7a and a narrow region 7b, wherein the wide region 7a is positioned closer to the smoothing capacitor 2 than the narrow region 7b. The second contact region has a straight alternating alignment of bonding positions of the first and second bonding-wires 3 and 4. The second contact region extends along the input side of the wide region 7a of the output side impedance line pattern 7. The narrow region 7b of the output side impedance line pattern 7 has a fourth contact region which extends in the width direction and along the output side of the output side impedance line pattern 7. A pair of impedance-matching capacitors 8 is provided between the output side impedance line pattern 7 and the output terminal 9. Each of the impedance-matching capacitors 8 is formed on a metal carrier 22 which is separated from the insulating substrate 12 on which the output side impedance line pattern 7 is provided. The fourth contact region of each of the output side impedance line patterns 7 is inter-connected through a plurality of third bonding-wires 5 to the impedance-matching capacitor 8. The fourth contact region of the narrow region 7b of the output side impedance line pattern 7 is narrower than the first, second and third contact regions. The third bonding-wires 5 extend in the transmission direction perpendicular to the width direction and are aligned in the width direction at a constant pitch. Each of the impedance-matching capacitors 8 is also inter-connected through a plurality of fourth bonding-wires 6 to the output thermal 9. The fourth bonding-wires 6 extend in the transmission direction perpendicular to the width direction and are aligned in the width direction at a constant pitch.

As shown in FIGS. 3A and 3B, the field effect transistor chip 24 extends in the width direction perpendicular to the transmission direction. The field effect transistor chip 24 comprises the semiconductor substrate 17 such as GaAs substrate, a gate electrode 15, an active region 14 and a drain electrode 16. The gate electrode 15, the active region 14 and the drain electrode 16 are formed on the semiconductor substrate 17. The active region 14 is interposed between the gate electrode 15 and the drain electrode 16. The gate electrode 15 is positioned in the input side of the active region 14, whilst the drain electrode 16 is positioned in the output side of the active region 14. The gate electrode 15 is slender-rectangle shaped and extends in the width direction. The active region 14 is also slender-rectangle shaped and extends in the width direction. The drain electrode 16 is also slender-rectangle shaped and extends in the width direction. A ground electrode 23 is also provided on a bottom of the semiconductor substrate 17. The semiconductor substrate 17 with the ground electrode 23 and the insulating substrate 12 are integrated on a common packaging board 13. The smoothing capacitor 2 is also integrated on the semiconductor substrate 17. The smoothing capacitor 2 comprises a bottom electrode layer 18, a dielectric layer 19 laminated on the bottom electrode 18 and a top electrode layer 20 laminated on the dielectric layer 19. The bottom electrode layer 18 may comprise an Au-plated layer. The dielectric layer 19 may comprise a high dielectric layer having a high dielectric constant $\epsilon_r$ of not less than 200 of $SrTiO_3$ (STO) which may be formed by an evaporation. The top electrode layer 20 may comprise an Au-plated layer.

The above smoothing capacitor 2 and the first bonding-wires 3 form the LC circuit which serves as a smoothing circuit for smoothing the distortion due to the differential frequency of the plural different carrier frequencies included in the microwave signal inputted into the input terminal of the microwave amplifier. The smoothing capacitor 2 is integrated together with the field effect transistor chip 24 on the semiconductor substrate 17 so that the smoothing capacitor 2 is positioned electrically close to the field effect transistor chip 24 for realizing immediate reduction in the distortion of the amplified microwave signal after the microwave signal have been amplified by the field effect transistor chip 24 as well as for allowing the length of the first bonding-wires 3 to be shorten to reduce a reactance of the LC circuit which comprises the smoothing capacitor 2 and the first bonding-wires 3. The reactance of the LC circuit serving as the smoothing circuit is provided by the first bonding wires 3. The first bonding wires 3 are aligned in the width direction, so that output side bonding positions of the first bonding-wires 3 are almost uniformly distributed at almost contact pitch throughout just or generally entire of the second contact region of the output side impedance line pattern 7, whilst input side bonding positions of the first bonding-wires 3 are almost uniformly distributed at almost contact pitch throughout just or generally entire of the third contact region of the smoothing capacitor 2. The capability of the LC circuit is independent from the width of the gate electrode of the field effect transistor chip 24. The reduction in length of each of the first bonding-wires 3 allows that a low frequency impedance in a low frequency wide band is reduced and kept in low level even a difference of the carrier frequencies is large. This means that the distortion characteristic of the microwave amplifier is improved by the reduced level of the low frequency impedance. If the resistance of the first bonding-wires 3 is assumed to be zero or the reactance R of the LC circuit is zero, then the impedance of the LC circuit is given by [$\omega L + 1/\omega C$] wherein L is the inductance and C is the capacitance. As the capacitance of the smoothing capacitor 2 is increased, then the low frequency impedance of the output side from the drain electrode 16 of the field effect transistor chip 24 depends on the inductance of the first bonding-wires 3. This means that the increase in the low frequency impedance provides no influence to the microwaves.

The equivalent circuit of the microwave amplifier connected to the external circuit is shown in FIG. 4. The smoothing capacitor 2 has a capacitance C1. The first bonding-wires 3 have a self-inductance L1. The output side part from the smoothing capacitor 2, for example, the circuitry including the impedance line pattern 7 and the impedance-matching capacitor 8 have an impedance Z1. The external circuit has an impedance Z2 and an inductance L2. The external circuit has a capacitance C2. The external circuit further has a ¼ wavelength line of one quarter of the amplified output microwave signal from the microwave amplifier.

The gate width of the field effect transistor in the above novel microwave amplifier is increased to increase the current amplification for obtaining the high output characteristic. The LC circuit comprising the smoothing capacitor 2 and the first bonding-wires 3 is connected to the almost entire of the second contact region extending in the width direction of the output side impedance line pattern 7, wherein almost entire of the second contact region is connected through the second bonding-wires 4 to almost entire of the first contact region of the field effect transistor chip 24, so as to reduce the impedance of the microwave component in the amplified microwave signals, for example, reduce the impedance to at most about 0.5 ohms.

The reactance of the LC circuit is reduced so that the reduction in impedance of the microwave component causes the reduced differential frequencies of the plural carrier frequencies, for example, about 20 MHz, whilst the amplified microwave frequency is about 2 GHz. Namely, the amplified microwave frequency is much larger by about one hundred times than the reduced differential frequencies of the plural carrier frequencies. The reduced differential frequencies of the plural carrier frequencies cause the reduced distortion. Namely, the output amplified microwave signal is well reduced in distortion and is well smoothed by the smoothing circuit or the LC circuit. The LC circuit is set in LC-constant so that the LC circuit shows a series resonance at the difference in the carrier frequencies, for which reason the LC circuit is high impedance to the carrier frequencies. In FIG. 4, the second bonding-wires 4 are interposed between the drain electrode of the FET and the resonant LC circuit comprising L1 and C1.

The microwave signal including plural different carrier frequencies is inputted through the input terminal into the distributor circuit, where the signal is distributed to be transmitted through the input side impedance matching line pattern to the gate electrode 15 of the field effect transistor chip 24 serving as the amplifier. The microwave signal is amplified by the active region 14 and then transmitted from the drain electrode 16 through the second bonding-wires 4 to the second contact region of the output side impedance line pattern 7, where the second contact region is also connected with the LC circuit serving as the smoothing circuit which comprises the first bonding-wires 3 and the smoothing capacitor 2. The transmitted amplified microwave signal is reduced in differential frequency of the carrier frequencies, whereby the amplified microwave signal is smoothed reduced in distortion due to the differential frequency of the carrier frequencies. The amplified and distortion-reduced microwave signal is then transmitted through the output side impedance line pattern 7 and the output side impedance-matching capacitor 8, where the microwave signal is impedance-matched. A plurality of the impedance-matched and distortion-reduced microwave signal are synthesized by the output terminal 9 and then outputted from the output terminal 9. The output microwave signal is high in output and reduced in distortion.

SECOND EMBODIMENT

Figure 5:
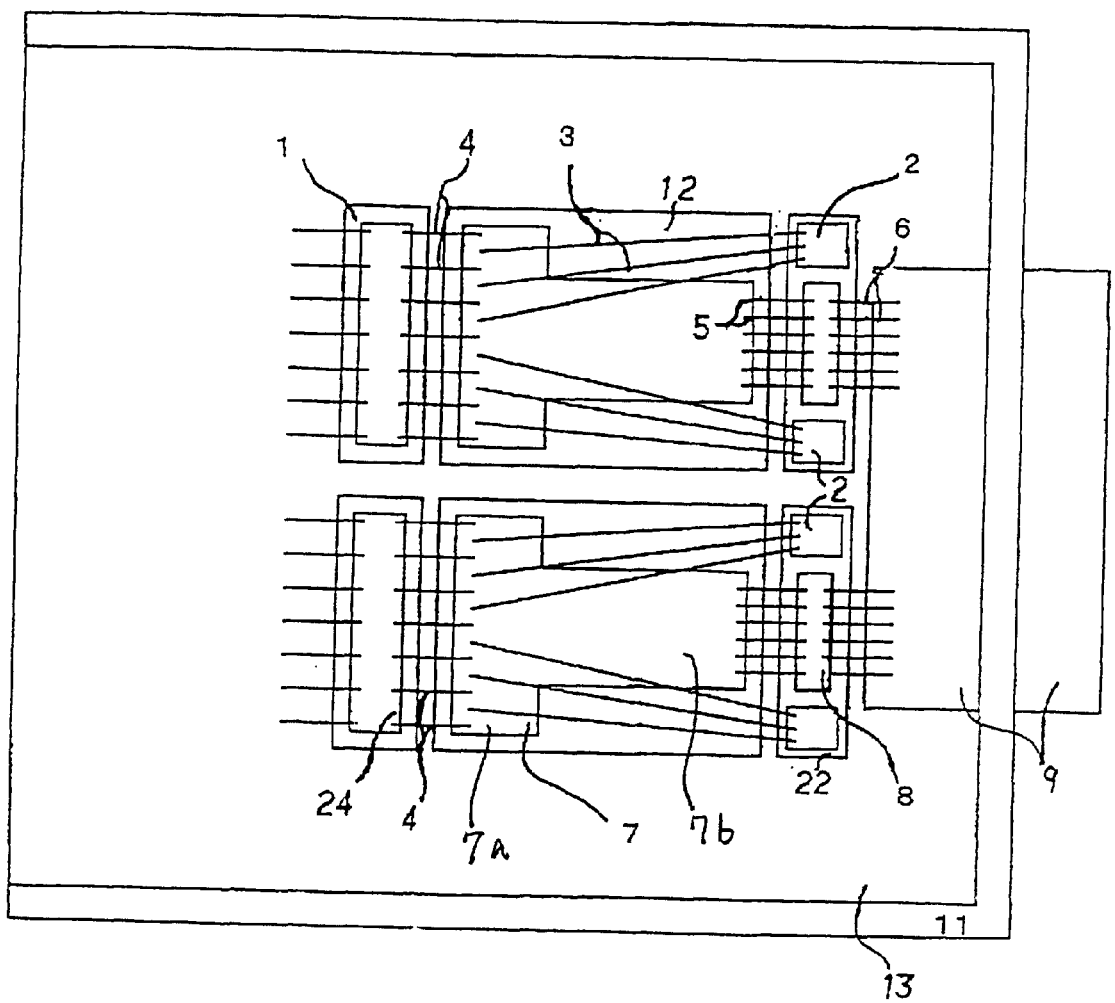
FIG. 5 is a fragmentary plane view illustrative of a circuit configuration between amplifying devices and an output terminal of a novel microwave amplifier in a second embodiment according to the present invention.

A second embodiment according to the present invention will be described in detail with reference to the drawings. FIG. 5 is a fragmentary plane view illustrative of a circuit configuration between amplifying devices and an output terminal of a novel microwave amplifier in a second embodiment according to the present invention. In the above first embodiment, the LC circuit comprising the smoothing capacitor and the bonding-wires is interposed between the field effect transistor serving as the microwave amplifier and the output side impedance line pattern. In this second embodiment, however, the LC circuit comprising the smoothing capacitor and the bonding-wires is positioned in the output side of the second contact region of the output side impedance line pattern so that the output side impedance line pattern is interposed between the field effect transistor and the LC circuit, wherein the smoothing capacitors are positioned in the output side of the output side impedance line pattern and positioned in opposite sides of the output side impedance-matching capacitor and distanced in the width direction, so that a pair of the smoothing capacitors and the output side impedance-matching capacitor are aligned in the width direction, wherein the output side impedance-matching capacitor is interposed between the paired smoothing capacitors in the width direction. The third contact region of each of the smoothing capacitor 2 is inter-connected through the first bonding-wires to the second contact region of the output side impedance line pattern.

A novel microwave amplifier has an input terminal, a distribution circuit connected to the input terminal and input side impedance matching devices connected to the distribution circuit, amplifying devices connected to the input side impedance matching devices for amplifying microwaves, output side impedance devices connected to the amplifying devices and an output terminal connected to the output side impedance devices as in the conventional microwave amplifier as described above. The improvement in the novel microwave amplifier is in the circuit configuration between the amplifying devices and the output terminal, for which reason the following descriptions will focus on the improved circuit configuration of the novel microwave amplifier.

A pair of field effect transistor chips 24 is provided for amplifying a microwave including plural different frequencies. Each of the field effect transistor chips 24 has a line-shaped first contact region extending in a width direction perpendicular to a transmission direction along which microwave signals are transmitted throughout the microwave amplifier. A pair of output side impedance lines 7 is provided to be close to but not in contact with the field effect transistor chips 24 in the transmission direction perpendicular to the width direction. Each of the output side impedance lines 7 has a line-shaped second contact region which is interconnected to the first contact region of the corresponding field effect transistor chip 24. The second contact region of each of the output side impedance lines 7 extends in the width direction. A pair of smoothing circuits is positioned in the output side of the second contact region of the output side impedance line pattern 7. The smoothing circuit is connected to just or generally entire of the second contact region of the output side impedance line pattern 7 for smoothing a distortion generated by a differential frequency of plural different carrier frequencies included in a microwave signal amplified by the field effect transistor chip 24. The LC circuit comprising the smoothing capacitors 3 and the first bonding-wires 3 is positioned in the output side of the second contact region of the output side impedance line pattern 7 so that the output side impedance line pattern 7 is interposed between the field effect transistor chip 24 and the LC circuit, wherein the smoothing capacitors 3 are positioned in the output side of the output side impedance line pattern 7 and positioned in opposite sides of the output side impedance-matching capacitor 8 and distanced in the width direction, so that a pair of the smoothing capacitors 2 and the output side impedance-matching capacitor 8 are aligned in the width direction, wherein the output side impedance-matching capacitor 8 is interposed between the paired smoothing capacitors 2 in the width direction. The third contact region of each of the smoothing capacitors 2 is inter-connected through the first bonding-wires 3 to the second contact region of the output side impedance line pattern 7. The first bonding-wires 3 are aligned in the width direction so that input side bonding positions of the first bonding-wires 3 are almost uniformly distributed at almost contact pitch throughout just or generally entire of the second contact region of the output side impedance line pattern 7, whilst output side bonding positions of the first bonding-wires 3 are almost uniformly distributed at almost contact pitch throughout just or generally entire of the third contact region of each of the paired smoothing capacitors 2. The first contact region of the field effect transistor chip 24 and the second contact region of the output side impedance line pattern 7 are inter-connected to each other through a plurality of second bonding-wires 4 which extend in the transmission direction and which are aligned in the width direction so that input side bonding positions of the second bonding-wires 4 are almost uniformly distributed over just or generally entire of the first contact region of the field effect transistor chip 24, whilst output side bonding positions of the second bonding-wires 4 are almost uniformly distributed over just or generally entire of the second contact region of the output side impedance line pattern 7. The second bonding-wires 4 are shorter than the first bonding-wires 3. The first and second contact regions have substantially the same width, whilst the third contact region of each of the paired smoothing capacitors is smaller in width than the first and second contact regions. On the second contact region of the output side impedance line pattern 7, the first and second bonding-wires 3 and 4 are aligned alternatively to form a single straight line of bonding positions. Each of the field effect transistor circuits 1 is formed on a semiconductor substrate 17. Each of the output side impedance line pattern 7 is provided on an insulative substrate 12 of alumina, and the first and second substrates are provided on a common package board. The output side impedance line pattern 7 has a wide region 7a and a narrow region 7b, wherein the wide region 7a is positioned closer to the field effect transistor chip 24 than the narrow region 7b. The second contact region has a straight alternating alignment of bonding positions of the first and second bonding-wires 3 and 4. The second contact region extends along the input side of the wide region 7a of the output side impedance line pattern 7. The narrow region 7b of the output side impedance line pattern 7 has a fourth contact region which extends in the width direction and along the output side of the output side impedance line pattern 7. A pair of impedance-matching capacitors 8 is provided between the output side impedance line pattern 7 and the output terminal 9. Each of the impedance-matching capacitors 8 is formed on a metal carrier 22 which is separated from the insulating substrate 12 on which the output side impedance line pattern 7 is provided. The fourth contact region of each of the output side impedance line patterns 7 is inter-connected through a plurality of third bonding-wires 5 to the impedance-matching capacitor 8. The fourth contact region of the narrow region 7b of the output side impedance line pattern 7 is narrower than the first and second contact regions. The third bonding-wires 5 extend in the transmission direction perpendicular to the width direction and are aligned in the width direction at a contact pitch. Each of the impedance-matching capacitors 8 is also inter-connected through a plurality of fourth bonding-wires 6 to the output thermal 9. The fourth bonding-wires 6 extend in the transmission direction perpendicular to the width direction and are aligned in the width direction at a contact pitch.

The reactance of the LC circuit is reduced so that the reduction in impedance of the microwave component causes the reduced differential frequencies of the plural carrier frequencies, so that the amplified microwave frequency is much larger than the reduced differential frequencies of the plural carrier frequencies. The reduced differential frequencies of the plural carrier frequencies cause the reduced distortion. Namely, the output amplified microwave signal is well reduced in distortion and is well smoothed by the smoothing circuit or the LC circuit. The LC circuit is set in LC-constant so that the LC circuit shows a series resonance at the difference in the carrier frequencies, for which reason the LC circuit is high impedance to the carrier frequencies.

The microwave signal including plural different carrier frequencies is inputted through the input terminal into the distributor circuit, where the signal is distributed to be transmitted through the input side impedance matching line pattern to the gate electrode 15 of the field effect transistor chip 24 serving as the amplifier. The microwave signal is amplified by the active region 14 and then transmitted from the drain electrode 16 through the second bonding-wires 4 to the second contact region of the output side impedance line pattern 7, where the second contact region is also connected with the LC circuit serving as the smoothing circuit which comprises the first bonding-wires 3 and the smoothing capacitor 2. The transmitted amplified microwave signal is reduced in differential frequency of the carrier frequencies, whereby the amplified microwave signal is smoothed reduced in distortion due to the differential frequency of the carrier frequencies. The amplified and distortion-reduced microwave signal is then transmitted through the output side impedance line pattern 7 and the output side impedance-matching capacitor 8, where the microwave signal is impedance-matched. A plurality of the impedance-matched and distortion-reduced microwave signal are synthesized by the output terminal 9 and then outputted from the output terminal 9. The output microwave signal is high in output and reduced in distortion.

THIRD EMBODIMENT

Figure 6:
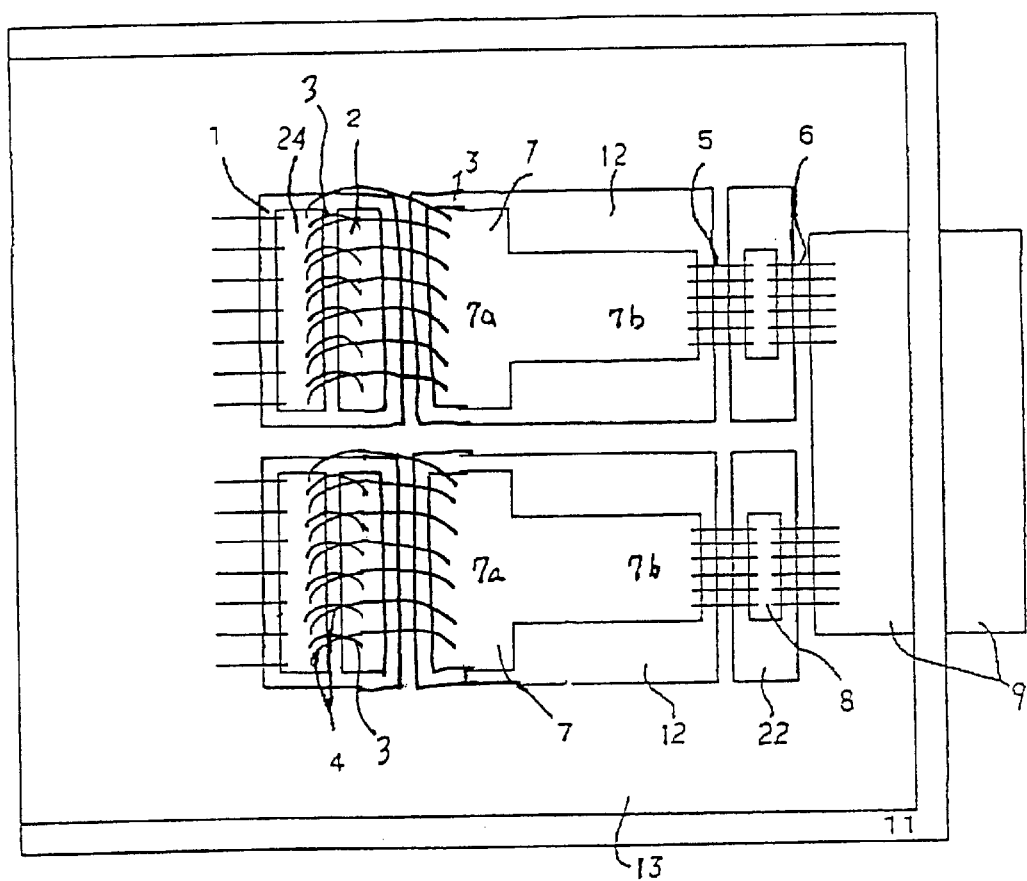
FIG. 6 is a fragmentary plane view illustrative of a circuit configuration between amplifying devices and an output terminal of a novel microwave amplifier in a third embodiment according to the present invention.
Figure 7A:
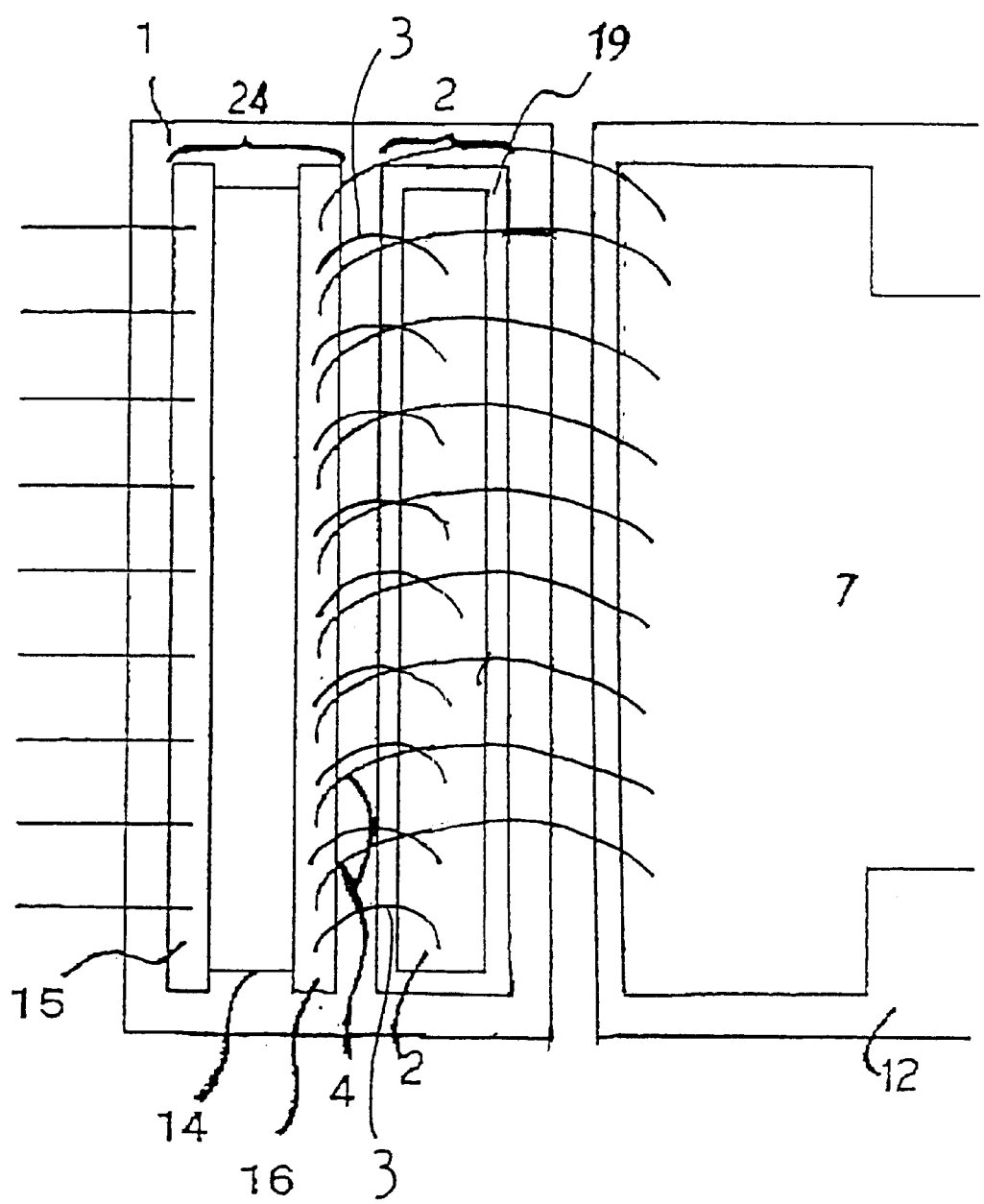
FIG. 7A is a fragmentary enlarged plane view illustrative of a third smoothing circuit configuration between amplifying devices and an output side impedance device of the novel microwave amplifier shown in FIG. 6.
Figure 7B:
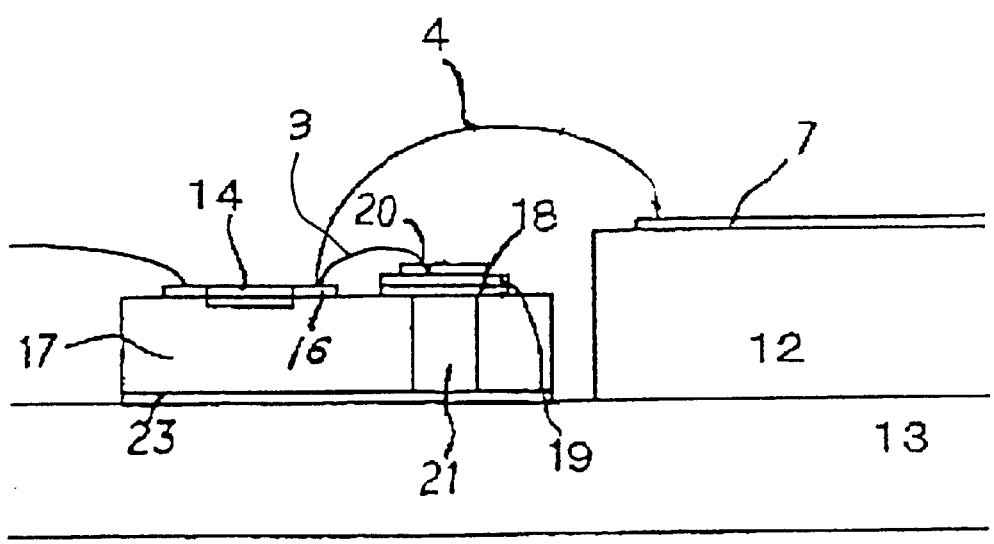
FIG. 7B is a fragmentary enlarged cross sectional elevation view illustrative of a first smoothing circuit configuration between amplifying devices and an output side impedance device of the novel microwave amplifier shown in FIG. 6.

A third embodiment according to the present invention will be described in detail with reference to the drawings. FIG. 6 is a fragmentary plane view illustrative of a circuit configuration between amplifying devices and an output terminal of a novel microwave amplifier in a third embodiment according to the present invention. FIG. 7A is a fragmentary enlarged plane view illustrative of a third smoothing circuit configuration between amplifying devices and an output side impedance device of the novel microwave amplifier shown in FIG. 6. FIG. 7B is a fragmentary enlarged cross sectional elevation view illustrative of a first smoothing circuit configuration between amplifying devices and an output side impedance device of the novel microwave amplifier shown in FIG. 6. In the first embodiment, the smoothing capacitor is connected to the second contact region of the output side impedance line pattern. In this third embodiment, the smoothing capacitor is connected to the first contact region of the field effect transistor chip.

A novel microwave amplifier has an input terminal, a distribution circuit connected to the input terminal and input side impedance matching devices connected to the distribution circuit, amplifying devices connected to the input side impedance matching devices for amplifying microwaves, output side impedance devices connected to the amplifying devices and an output terminal connected to the output side impedance devices as in the conventional microwave amplifier as described above. The improvement in the novel microwave amplifier is in the circuit configuration between the amplifying devices and the output terminal, for which reason the following descriptions will focus on the improved circuit configuration of the novel microwave amplifier.

A pair of field effect transistor chips 24 is provided for amplifying a microwave including plural different frequencies. Each of the field effect transistor chips 24 has a line-shaped first contact region extending in a width direction perpendicular to a transmission direction along which microwave signals are transmitted throughout the microwave amplifier. A pair of output side impedance lines 7 is provided to be distanced from the field effect transistor chips 24 in the transmission direction perpendicular to the width direction. Each of the output side impedance lines 7 has a line-shaped second contact region which is interconnected to the first contact region of the corresponding field effect transistor chip 24. The second contact region of each of the output side impedance lines 7 extends in the width direction. A pair of smoothing circuits extends in the width direction and is interposed between the field effect transistor chip 24 and the output side impedance line pattern 7. The smoothing circuit is connected to just or generally entire of the first contact region of the field effect transistor chip 24 for smoothing a distortion generated by a differential frequency of plural different carrier frequencies included in a microwave signal amplified by the field effect transistor chip 24. Each of the smoothing circuits comprises an LC circuit which further comprises a smoothing capacitor 2 extending in the width direction and being interposed between the field effect transistor chip 24 and the output side impedance line pattern 7, and a first interconnection structure 3 interconnecting a third contact region of the smoothing capacitor 2 to just or generally entire of the first contact region of the field effect transistor chip 24. The first interconnection structure 3 comprises a plurality of first bonding-wires 3 extending in the transmission direction and being aligned in the width direction so that input side bonding positions of the first bonding-wires 3 are almost uniformly distributed at almost contact pitch throughout just or generally entire of the first contact region of the field effect transistor chip 24, whilst output side bonding positions of the first bonding-wires 3 are almost uniformly distributed at almost contact pitch throughout just or generally entire of the third contact region of the smoothing capacitor 2. The first contact region of the field effect transistor chip 24 and the second contact region of the output side impedance line pattern 7 are inter-connected to each other through a plurality of second bonding-wires 4 which extend in the transmission direction and which are aligned in the width direction so that input side bonding positions of the second bonding-wires 4 are almost uniformly distributed over just or generally entire of the first contact region of the field effect transistor chip 24, whilst output side bonding positions of the second bonding-wires 4 are almost uniformly distributed over just or generally entire of the second contact region of the output side impedance line pattern 7. The second bonding-wires 4 are longer than the first bonding-wires 3. The first, second and third contact regions have substantially the same width. On the first contact region of the field effect transistor chip 24, the first and second bonding-wires 3 and 4 are aligned alternatively to form a single straight line of bonding positions. The smoothing capacitor 2 and the field effect transistor chip 24 are integrated in a single field effect transistor circuit 1 which is positioned input side of the output side impedance line pattern 7. Each of the field effect transistor circuits 1 is formed on a semiconductor substrate 17. Each of the output side impedance line pattern 7 is provided on an insulative substrate 12 of alumina, and the first and second substrates are provided on a common package board. The output side impedance line pattern 7 has a wide region 7a and a narrow region 7b, wherein the wide region 7a is positioned closer to the smoothing capacitor 2 than the narrow region 7b. The second contact region extends along the input side of the wide region 7a of the output side impedance line pattern 7. The narrow region 7b of the output side impedance line pattern 7 has a fourth contact region which extends in the width direction and along the output side of the output side impedance line pattern 7. A pair of impedance-matching capacitors 8 is provided between the output side impedance line pattern 7 and the output terminal 9. Each of the impedance-matching capacitors 8 is formed on a metal carrier 22 which is separated from the insulating substrate 12 on which the output side impedance line pattern 7 is provided. The fourth contact region of each of the output side -impedance line patterns 7 is inter-connected through a plurality of third bonding-wires 5 to the impedance-matching capacitor 8. The fourth contact region of the narrow region 7b of the output side impedance line pattern 7 is narrower than the first, second and third contact regions. The third bonding-wires 5 extend in the transmission direction perpendicular to the width direction and are aligned in the width direction at a contact pitch. Each of the impedance-matching capacitors 8 is also inter-connected through a plurality of fourth bonding-wires 6 to the output thermal 9. The fourth bonding-wires 6 extend in the transmission direction perpendicular to the width direction and are aligned in the width direction at a contact pitch.

As shown in FIGS. 7A and 7B, the field effect transistor chip 24 extends in the width direction perpendicular to the transmission direction. The field effect transistor chip 24 comprises the semiconductor substrate 17 such as GaAs substrate, a gate electrode 15, an active region 14 and a drain electrode 16. The gate electrode 15, the active region 14 and the drain electrode 16 are formed on the semiconductor substrate 17. The active region 14 is interposed between the gate electrode 15 and the drain electrode 16. The gate electrode 15 is positioned in the input side of the active region 14, whilst the drain electrode 16 is positioned in the output side of the active region 14. The gate electrode 15 is slender-rectangle shaped and extends in the width direction. The active region 14 is also slender-rectangle shaped and extends in the width direction. The drain electrode 16 is also slender-rectangle shaped and extends in the width direction. A ground electrode 23 is also provided on a bottom of the semiconductor substrate 17. The semiconductor substrate 17 with the ground electrode 23 and the insulating substrate 12 are integrated on a common packaging board 13. The smoothing capacitor 2 is also integrated on the semiconductor substrate 17. The smoothing capacitor 2 comprises a bottom electrode layer 18, a dielectric layer 19 laminated on the bottom electrode 18 and a top electrode layer 20 laminated on the dielectric layer 19. The bottom electrode layer 18 may comprise an Au-plated layer. The dielectric layer 19 may comprise a high dielectric layer having a high dielectric constant $\epsilon_r$ of not less than 200 of $SrTiO_3$ (STO) which may be formed by an evaporation. The top electrode layer 20 may comprise an Au-plated layer.

The reactance of the LC circuit is reduced so that the reduction in impedance of the microwave component causes the reduced differential frequencies of the plural carrier frequencies, so that the amplified microwave frequency is much larger than the reduced differential frequencies of the plural carrier frequencies. The reduced differential frequencies of the plural carrier frequencies cause the reduced distortion. Namely, the output amplified microwave signal is well reduced in distortion and is well smoothed by the smoothing circuit or the LC circuit. The LC circuit is set in LC-constant so that the LC circuit shows a series resonance at the difference in the carrier frequencies, for which reason the LC circuit is high impedance to the carrier frequencies.

The microwave signal including plural different carrier frequencies is inputted through the input terminal into the distributor circuit, where the signal is distributed to be transmitted through the input side impedance matching line pattern to the gate electrode 15 of the field effect transistor chip 24 serving as the amplifier. The microwave signal is amplified by the active region 14 and then transmitted from the drain electrode 16 through the second bonding-wires 4 to the second contact region of the output side impedance line pattern 7, where the second contact region is also connected with the LC circuit serving as the smoothing circuit which comprises the first bonding-wires 3 and the smoothing capacitor 2. The transmitted amplified microwave signal is reduced in differential frequency of the carrier frequencies, whereby the amplified microwave signal is smoothed reduced in distortion due to the differential frequency of the carrier frequencies. The amplified and distortion-reduced microwave signal is then transmitted through the output side impedance line pattern 7 and the output side impedance-matching capacitor 8, where the microwave signal is impedance-matched. A plurality of the impedance-matched and distortion-reduced microwave signal are synthesized by the output terminal 9 and then outputted from the output terminal 9. The output microwave signal is high in output and reduced in distortion.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A microwave amplifier, comprising:
   an amplifying device having a first contact region extending in a width direction that is perpendicular to a transmission direction of the microwave amplifier;
   an output side impedance device spaced from said amplifying device in the transmission direction, said output side impedance device having a second contact region extending in the width direction that is connected to said first contact region with a plurality of spaced apart first bonding wires; and
   a smoothing circuit for smoothing distortions in a signal amplified by said amplifying device, said smoothing circuit having a third contact region extending in the width direction, said third contact region being connected to one of said first and second contact regions with a plurality of spaced apart second bonding wires.

2. The microwave amplifier as claimed in claim 1, wherein said smoothing circuit extends in said width direction and is interposed between said amplifying device and said output side impedance device.

3. The microwave amplifier as claimed in claim 1, wherein said smoothing circuit comprises an LC circuit which further comprises:
   a smoothing capacitor extending in said width direction and being interposed between said amplifying device and said output side impedance device; and
   an interconnection structure inter-connecting said third contact region of said smoothing capacitor to said second contact region.

4. The microwave amplifier as claimed in claim 1, wherein said first contact region, said second contact region, and said third contact region have substantially the same width.

5. The microwave amplifier as claimed in claim 1, wherein said second contact region comprises a single straight line of bonding positions to which said first and second bonding wires are alternately attached.

6. The microwave amplifier as claimed in claim 1, wherein said smoothing circuit and said amplifying device are on a first substrate and said output side impedance device is on a second substrate, and wherein said first and second substrates are on a common package board.

7. The microwave amplifier as claimed in claim 1, wherein said amplifying device comprises a field effect transistor chip having plural field effect transistors.

8. The microwave amplifier of claim 1, wherein said smoothing circuit is located between said amplifying device and said output side impedance device.

9. The microwave amplifier of claim 1, wherein said smoothing circuit comprises an LC circuit.

10. The microwave amplifier of claim 1, wherein said first bonding wires are spaced apart uniformly and said second bonding wires are spaced apart uniformly.

11. The microwave amplifier of claim 1, wherein said first bonding wires are longer than said second bonding wires.

12. The microwave amplifier of claim 1, wherein said third contact region is connected to said first contact region with said plurality of second bonding wires.

13. The microwave amplifier of claim 1, wherein said third contact region is connected to said second contact region with said plurality of second bonding wires.

14. A microwave amplifier, comprising:
   an amplifying device having a first contact region extending in a width direction that is perpendicular to a transmission direction of the microwave amplifier;
   an output side impedance device spaced from said amplifying device in the transmission direction, said output side impedance device having a second contact region extending in the width direction that is connected to said first contact region; and
   a smoothing circuit for smoothing distortions in a signal amplified by said amplifying device, said smoothing circuit being located at an output side of said second contact region so that said second contact region is between said amplifying device and said smoothing circuit, said smoothing circuit being connected to one of said first and second contact regions.

15. The microwave amplifier of claim 14, wherein said amplifying device comprises a field effect transistor chip having plural field effect transistors.

16. The microwave amplifier of claim 14, wherein said second contact region is connected to said first contact region with a plurality of spaced apart first bonding wires, and said smoothing circuit has a third contact region extending in a width direction, said third contact region being connected to one of said first and second contact regions with a plurality of spaced apart second bonding wires.

17. The microwave amplifier of claim 16, wherein said first bonding wires are longer than said second bonding wires.

18. The microwave amplifier of claim 16, wherein said third contact region is connected to said first contact region with said plurality of second bonding wires.

19. The microwave amplifier of claim 16, wherein said third contact region is connected to said second contact region with said plurality of second bonding wires.

20. The microwave amplifier as claimed in claim 14, wherein said smoothing circuit comprises an LC circuit which further comprises:
   at least a pair of smoothing capacitors positioned at the output side of said output side impedance device so that said output side impedance device is between said amplifying device and said smoothing capacitors; and an interconnection structure inter-connecting a third contact region of each of said smoothing capacitors to one of said first and second contact regions.

21. The microwave amplifier as claimed in claim 20, wherein said interconnection structure comprises a plurality of first bonding-wires extending almost in said transmission direction and being aligned in said width direction so that said first bonding-wires are almost uniformly distributed over said one of the first and second contact regions and also over said third contact region.

22. The microwave amplifier as claimed in claim 21, wherein said first contact region of said amplifying device and said second contact region of said output side impedance device are inter-connected to each other through a plurality of second bonding-wires which extend in said transmission direction and which are aligned in said width direction so that said second bonding-wires are almost uniformly distributed over said first contact region and also over said second contact region, and said second bonding-wires are shorter than said first bonding-wires.

23. The microwave amplifier as claimed in claim 20, wherein said first and second contact regions have substantially the same width and each said third contact region is narrower than said first and second contact regions.

24. The microwave amplifier as claimed in claim 22, wherein, on said second contact region, said first and second bonding-wires are aligned alternatively to form a single straight line of bonding positions.

25. The microwave amplifier as claimed in claim 20, wherein said smoothing capacitors are on a metal carrier together with at least an impedance-matching capacitor, and said amplifying device is on a first substrate, and said output side impedance device is on a second substrate, and wherein said first and second substrates and said metal carrier are provided on a common package board.

26. A microwave amplifier having:
   a field effect transistor chip for amplifying a microwave signal including a plurality of different frequencies, said field effect transistor chip having a transistor contact region extending in a width direction;
   an output side impedance device being distanced from said field effect transistor chip in a transmission direction perpendicular to said width direction, said output side impedance device having an output contact region interconnected to said transistor contact region, said output contact region extending in said width direction; and
   a smoothing circuit positioned in an output side of said output contact region, so that said output contact region is interposed between said field effect transistor chip and said smoothing circuit, said smoothing circuit being connected to said output contact region for smoothing a distortion generated by the plurality of different frequencies in the microwave signal, and wherein said smoothing circuit comprises an LC circuit which further comprises:
   a smoothing capacitor extending in said width direction and being interposed between said field effect transistor chip and said output side impedance device; and
   an interconnection structure inter-connecting a capacitor contact region of said smoothing capacitor to said output contact region.

27. The microwave amplifier as claimed in claim 26, wherein said smoothing circuit comprises an LC circuit which further comprises:
   at least a pair of smoothing capacitors positioned in an output side of said output side impedance device so that said output side impedance device is interposed between said field effect transistor chip and said smoothing capacitors; and
   an interconnection structure inter-connecting a capacitor contact region of each of said smoothing capacitors to said output contact region.

28. The microwave amplifier as claimed in claim 27, wherein said interconnection structure comprises a plurality of first bonding-wires extending almost in said transmission direction and being aligned in said width direction so that said first bonding-wires are almost uniformly distributed over said output contact region and also over said capacitor contact region.

29. The microwave amplifier as claimed in claim 28, wherein said transistor contact region of said field effect transistor chip and said output contact region are interconnected to each other through a plurality of second bonding-wires which extend in said transmission direction and which are aligned in said width direction so that said second bonding-wires are almost uniformly distributed over said transistor contact region and also over said output contact region, and said second bonding-wires are shorter than said first bonding-wires.

30. The microwave amplifier as claimed in claim 29, wherein said transistor contact region, said output contact region, and said capacitor contact region have substantially the same width and said capacitor contact region of each of said smooth capacitors is narrower than said transistor contact region and said output contact region.

31. The microwave amplifier as claimed in claim 30, wherein, on said output contact region, said first and second bonding-wires are aligned alternatively to form a single straight line of bonding positions.

32. The microwave amplifier as claimed in claim 27, wherein said smoothing capacitors are arranged on a metal carrier together with at least an impedance-matching capacitor, said field effect transistor chip being formed on a first substrate, and said output side impedance device being provided on a second substrate, and said first and second substrates and said metal carrier being provided on a common package board.

* * * * *